(12) United States Patent
Park et al.

(10) Patent No.: US 10,283,268 B2
(45) Date of Patent: May 7, 2019

(54) MULTILAYER CAPACITOR AND BOARD HAVING THE SAME

(71) Applicant: SAMSUNG ELECTRO-MECHANICS CO., LTD., Suwon-si, Gyeonggi-do (KR)

(72) Inventors: Min Cheol Park, Suwon-si (KR); Young Ghyu Ahn, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 28 days.

(21) Appl. No.: 15/260,475

(22) Filed: Sep. 9, 2016

(65) Prior Publication Data

US 2017/0164466 A1 Jun. 8, 2017

(30) Foreign Application Priority Data

Dec. 4, 2015 (KR) ........................ 10-2015-0172246

(51) Int. Cl.
*H05K 1/02* (2006.01)
*H01G 4/018* (2006.01)
(Continued)

(52) U.S. Cl.
CPC ............. *H01G 4/018* (2013.01); *H01G 4/005* (2013.01); *H01G 4/232* (2013.01); *H01G 4/30* (2013.01);
(Continued)

(58) Field of Classification Search
CPC .................................................. H05K 1/0231
(Continued)

(56) References Cited

U.S. PATENT DOCUMENTS 5,835,338 A * 11/1998 Suzuki ................. H01G 4/30
361/301.4
6,765,781 B2 7/2004 Togashi
(Continued)

FOREIGN PATENT DOCUMENTS

JP 9-180956 A 7/1997
JP 4929487 B2 5/2012
(Continued)

OTHER PUBLICATIONS

Korean Office Action issued in Korean Application No. 10-2015-0172246, dated Oct. 13, 2016, with English translation.

*Primary Examiner* — Stanley Tso
(74) *Attorney, Agent, or Firm* — Morgan Lewis & Bockius LLP (57) ABSTRACT

A multilayer capacitor includes a capacitor body including a first capacitance forming region and a second capacitance forming region disposed to face each other with a connection region of a predetermined thickness in which an internal electrode is not formed disposed therebetween, a thickness of the first capacitance forming region being greater than a thickness of the second capacitance forming region. The first capacitance forming region includes first and second internal electrodes. The second capacitance forming region includes a third and fourth internal electrodes. The connection region includes at least one dummy electrode disposed to have a shorter average distance to the first capacitance forming region than to the second capacitance forming region.

7 Claims, 7 Drawing Sheets

(51) Int. Cl.
*H05K 1/18* (2006.01)
*H01G 4/30* (2006.01)
*H01G 4/35* (2006.01)
*H01G 4/232* (2006.01)
*H01G 4/005* (2006.01)
*H05K 3/34* (2006.01)

(52) U.S. Cl.
CPC ............... *H01G 4/35* (2013.01); *H05K 1/181* (2013.01); *H05K 3/3442* (2013.01); *H05K 2201/10015* (2013.01); *Y02P 70/611* (2015.11)

(58) Field of Classification Search
USPC ........................................................ 174/260
See application file for complete search history.

(56) References Cited

U.S. PATENT DOCUMENTS

| | | | | |
|---|---|---|---|---|
| 8,250,747 | B2 * | 8/2012 | Togashi | ................. H01G 2/065 29/25.03 |
| 2010/0220426 | A1 | 9/2010 | Shimizu | |
| 2013/0033154 | A1 * | 2/2013 | Sakuratani | ............... H01G 4/30 310/366 |
| 2013/0241361 | A1 | 9/2013 | Lee et al. | |
| 2014/0083755 | A1 * | 3/2014 | Lee | ......................... H05K 1/181 174/260 |
| 2014/0131082 | A1 * | 5/2014 | Ahn | ...................... H05K 3/3442 174/260 |
| 2014/0133064 | A1 | 5/2014 | Ahn et al. | |
| 2014/0226255 | A1 * | 8/2014 | Chung | .................... H01G 4/002 361/301.4 |
| 2014/0240897 | A1 * | 8/2014 | Chung | ..................... H01G 4/30 361/301.4 |
| 2014/0311788 | A1 | 10/2014 | Park et al. | |
| 2015/0014033 | A1 | 1/2015 | Park et al. | |
| 2015/0016014 | A1 | 1/2015 | Park et al. | |
| 2015/0243440 | A1 * | 8/2015 | Gong | ...................... H01G 4/30 174/260 |

FOREIGN PATENT DOCUMENTS

| | | |
|---|---|---|
| KR | 10-2013-0104338 A | 9/2013 |
| KR | 10-2014-0060392 A | 5/2014 |
| KR | 2014-0060393 A | 5/2014 |
| KR | 10-2014-0126081 A | 10/2014 |
| KR | 10-2015-0007480 A | 1/2015 |
| KR | 2015-0007581 A | 1/2015 |
| KR | 10-1539852 B1 | 7/2015 |

* cited by examiner

PRIOR ART

FIG. 7

PRIOR ART

MULTILAYER CAPACITOR AND BOARD HAVING THE SAME

CROSS-REFERENCE TO RELATED APPLICATION

This application claims the benefit of priority to Korean Patent Application No. 10-2015-0172246, filed on Dec. 4, 2015 with the Korean Intellectual Property Office, the entirety of which is incorporated herein by reference.

BACKGROUND

The present disclosure relates to a multilayer capacitor and a board having the same.

In IT devices such as mobile phones or PCs, a DC-DC converter converting voltage of a battery into voltage at which an integrated circuit operates is used in order to stably operate the integrated circuit.

The DC-DC converter may radiate high frequency noise. Ringing may occur due to inductance on a power path and parasitic capacitance of a field effect transistor (FET) during switching of the FET, which may cause an electronic wave obstacle such as electromagnetic interference (EMI) in peripheral circuits.

In particular, in the case of a small portable terminal such as a smartphone or a tablet PC, since analog circuits such as a power circuit, a wireless circuit, a sound circuit, etc. are adjacent to each other, an obstacle to communication and a deterioration in sound quality occur when the electronic wave obstacle occurs, and thus quality of the small portable terminal may deteriorate.

SUMMARY

An aspect of the present disclosure provides a multilayer capacitor reducing a ripple voltage generated at high frequency, thereby reducing high frequency noise and EMI, and a board having the same.

According to an aspect of the present disclosure, a multilayer capacitor includes: a capacitor body including a first capacitance forming region and a second capacitance forming region disposed to face each other with a connection region of a predetermined thickness in which an internal electrode is not formed disposed therebetween, a thickness of the first capacitance forming region being greater than a thickness of the second capacitance forming region, and the connection region including at least one or more dummy electrodes disposed at locations approaching the first capacitance forming region, and a board having the same.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate) , is referred to as being "on, " "connected to, " or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

For a clear description of the exemplary embodiments in the present disclosure, L, W, and T directions of a hexahedron shown in the drawings are respectively defined as a length direction, a width direction, and a thickness direction.

For convenience of description, in the present exemplary embodiment, lower and upper surfaces of a capacitor body are set as first and second surfaces 1 and 2, respectively, both surfaces thereof in the length direction are set as third and fourth surfaces 3 and 4, respectively, and both surfaces thereof in the width direction are set as fifth and sixth surfaces 5 and 6, respectively. In this regard, the first surface 1 is also set as a mounting surface.

Multilayer Capacitor

Figure 1:
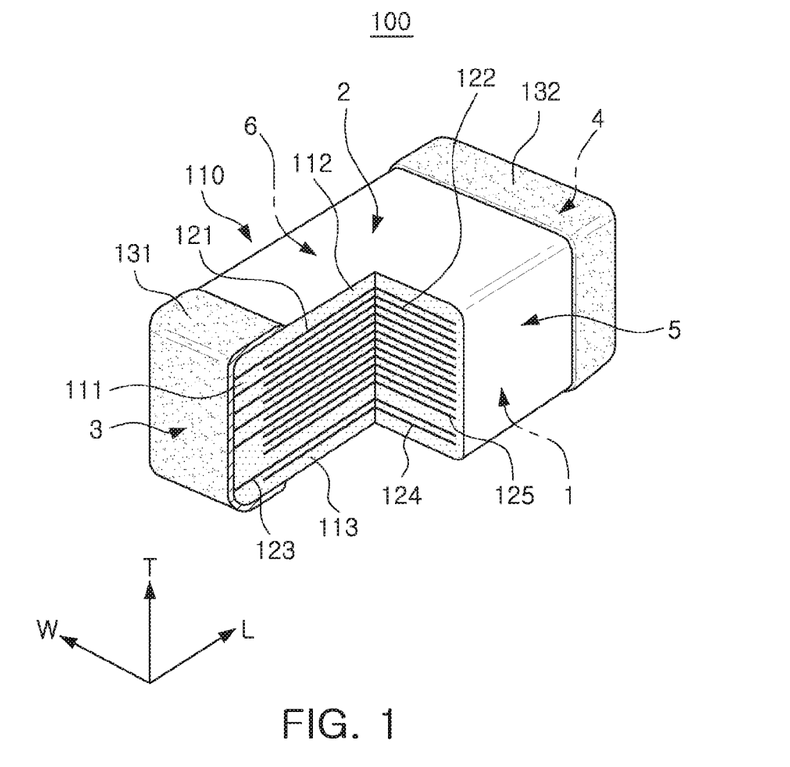
FIG. 1 is a perspective view schematically illustrating a partially cut multilayer capacitor according to an exemplary embodiment in the present disclosure.
Figure 2:
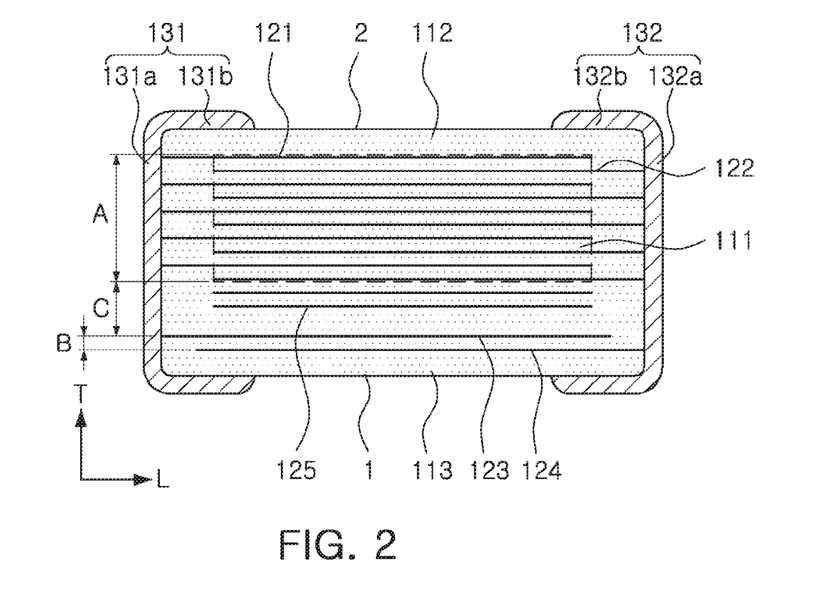
FIG. 2 is a cross-sectional view of the multilayer capacitor of FIG. 1 that is cut in a length direction.

FIG. 1 is a perspective view schematically illustrating a partially cut multilayer capacitor according to an exemplary embodiment in the present disclosure. FIG. 2 is a cross-sectional view of the multilayer capacitor of FIG. 1 that is cut in a length direction.

Referring to FIGS. 1 and 2, a multilayer capacitor 100 according to an exemplary embodiment in the present disclosure may include a capacitor body 110 and first and second external electrodes 131 and 132 formed at both ends of the capacitor body 110 in a length direction.

The first and second external electrodes 131 and 132 may be formed of a conductive paste including a conductive metal.

In this regard, the conductive metal may be, for example, nickel (Ni), copper (Cu), palladium (Pd), gold (Au), or alloys thereof, but the conductive metal is not limited thereto.

The first and second external electrodes 131 and 132 may include first and second connection parts 131a and 132a formed on third and fourth surfaces 3 and 4 of the capacitor body 110 and first and second band parts 131b and 132b extending from the first and second connection parts 131a and 132a to a portion of a first surface 1 of the capacitor body 110.

In this regard, the first and second band parts 131b and 132b may further extend to a portion of a second surface 2 of the capacitor body 110 and portions of fifth and six surfaces 5 and 6 of the capacitor body 110.

Plating may be performed on surfaces of the first and second external electrodes 131 and 132 in order to improve solderability when the first and second external electrodes 131 and 132 are mounted on a board.

The capacitor body 110 may be formed by stacking and then sintering a plurality of dielectric layers 111. A shape and a size of the capacitor body 110 and the stack number of the plurality of dielectric layers 111 are not limited to those shown in the present exemplary embodiment.

The dielectric layers 111 may include ceramic powder having a high dielectric constant, for example, a barium titanate ($BaTiO_3$) based powder or a strontium titanate ($SrTiO_3$) based powder, but the dielectric layers 111 are not limited thereto.

In this regard, in the present exemplary embodiment, the dielectric layers 111 may be stacked in a thickness direction in such a manner that the dielectric layers 111 are parallel to the first surface 1 that is a mounting surface.

The plurality of dielectric layers 111 forming the capacitor body 110 maybe in a sintered state so that the adjacent dielectric layers 111 may be integrated to the extent that it is difficult to acknowledge boundaries of the adjacent dielectric layers 111 without using a scanning electron microscope (SEM).

The capacitor body 110 may include a first capacitance forming region A as a high capacitance region and a second capacitance forming region B as a low capacitance and high ESR region, and may have different impedance characteristics. A connection region C of a predetermined thickness in which no internal electrode is formed may be disposed between the first capacitance forming region A and the second capacitance forming region B so that a high ESR characteristic of a low capacitance region is implemented.

In this regard, a surface of the capacitor body 110 adjacent to the second capacitance forming region B may be the mounting surface.

An upper cover layer 112 may be disposed on an upper portion of the first capacitance forming region A. A lower cover layer 113 may be disposed on a lower portion of the second capacitance forming region B.

The first capacitance forming region A may be formed by repeatedly stacking a plurality of first and second internal electrodes 121 and 122 with the dielectric layers 111 as capacitance contributing parts disposed therebetween.

Figure 3A:
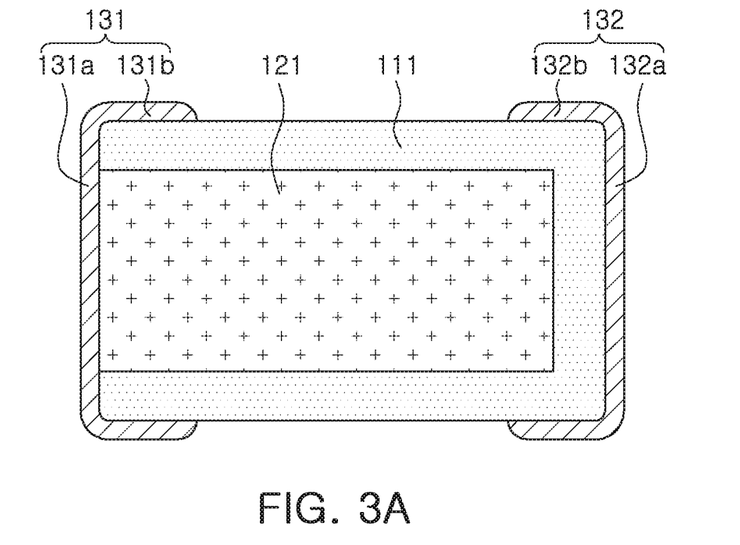
FIGS. 3A and 3B are plan views of structures of first and second internal electrodes of FIG. 1, respectively.
Figure 3B:
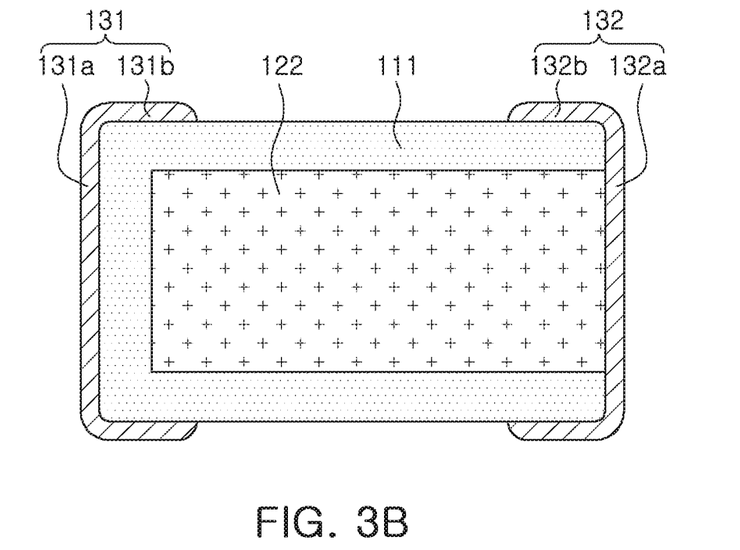

Referring to FIGS. 3A and 3B, the first and second internal electrodes 121 and 122 may be electrodes having different polarities, and may be formed by printing a predetermined thickness of a conductive paste including a conductive metal on the dielectric layers 111. The first and second internal electrodes 121 and 122 may be disposed in a horizontal direction to be parallel with respect to the first surface 1 along a stacking direction of the dielectric layers 111, and may be formed to be alternately exposed to the third and fourth surfaces 3 and 4.

In this regard, the first and second internal electrodes 121 and 122 may be electrically insulated from each other by the dielectric layers 111 disposed therebetween. The first and second internal electrodes 121 and 122 may be formed to generally have a uniform width, and may be configured as a structure in which ESR does not greatly increase.

Portions of the first and second internal electrodes 121 and 122 alternately exposed to the third and fourth surfaces 3 and 4 of the capacitor body 110 may be respectively electrically connected to first and second external electrodes 131 and 132.

Therefore, if voltage is applied to the first and second external electrodes 131 and 132, electric charge may accumulate between the first and second internal electrodes 121 and 122 facing each other. In this regard, capacitance of the multilayer capacitor 100 may be in proportion to an area of a region of the first and second internal electrodes 121 and 122 that overlap each other.

The conductive metal included in the conductive paste forming the first and second internal electrodes 121 and 122 may be, for example, nickel (Ni), copper (Cu), palladium (Pd), or alloys thereof, but the conductive metal is not limited thereto.

In this regard, a method of printing the conductive paste may include a screen printing method or a gravure printing method, etc., but the method of printing the conductive paste is not limited thereto.

The second capacitance forming region B may be formed by repeatedly stacking a plurality of third and fourth internal electrodes 123 and 124 with the dielectric layers 111 disposed therebetween, and may have a smaller thickness than the first capacitance forming region A.

Figure 4A:
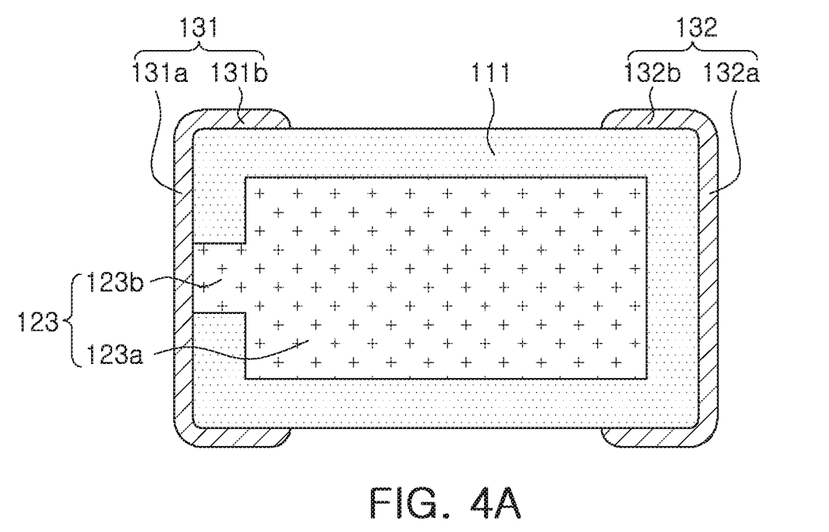
FIGS. 4A and 4B are plan views of structures of third and fourth internal electrodes of FIG. 1, respectively.
Figure 4B:
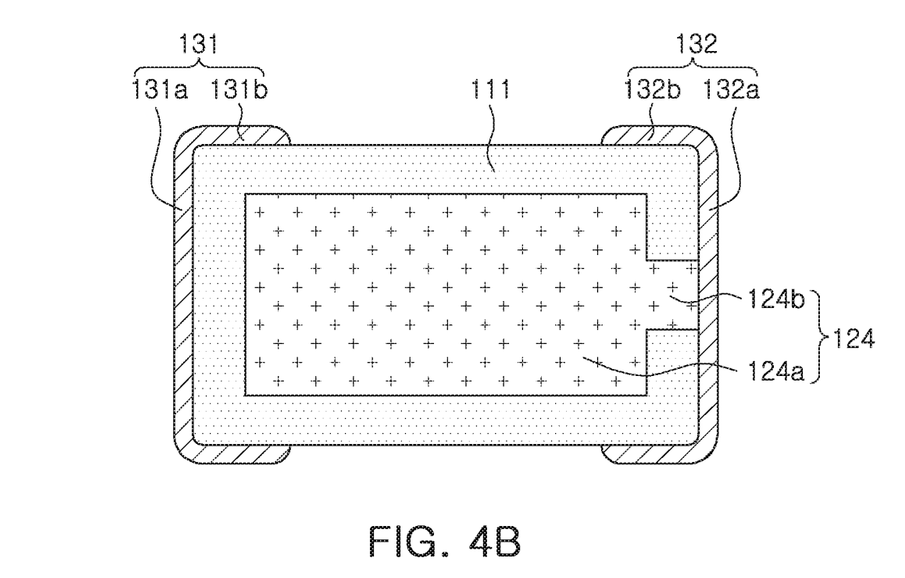

Referring to FIGS. 4A and 4B, the third and fourth internal electrodes 123 and 124 may be electrodes having different polarities, and may be formed by printing a predetermined thickness of a conductive paste including a conductive metal on the dielectric layers 111. The third and fourth internal electrodes 123 and 124 may be disposed in the horizontal direction to be parallel with respect to the first surface 1 along the stacking direction of the dielectric layers 111, and may be formed to be alternately exposed to the third and fourth surfaces 3 and 4.

In this regard, the third and fourth internal electrodes 123 and 124 may be electrically insulated from each other by the dielectric layers 111 disposed therebetween.

The third and fourth internal electrodes 123 and 124 may include first and second body parts 123a and 124a configured to overlap each other and first and second lead parts 123b and 124b extending from the first and second body parts 123a and 124a to be exposed to the third and fourth surfaces 3 and 4, respectively, of the capacitor body 110.

Portions of the first and second lead parts 123b and 124b alternately exposed to the third and fourth surfaces 3 and 4 of the capacitor body 110 may be respectively electrically connected to first and second external electrodes 131 and 132.

The first and second lead parts 123b and 124b may be formed to have smaller widths than the first and second body parts 123a and 124a. As such, the first and second lead parts 123b and 124b may be formed to have smaller widths than the first and second body parts 123a and 124a, and thus ESR increases at a high frequency, thereby inhibiting high frequency noise from being generated.

Therefore, if voltage is applied to the first and second external electrodes 131 and 132, charge may accumulate between the third and fourth internal electrodes 123 and 124 facing each other. In this regard, capacitance of the multilayer capacitor 100 may be in proportion to an area of a region of the third and fourth internal electrodes 123 and 124 that overlap each other.

The conductive metal included in the conductive paste forming the third and fourth internal electrodes 123 and 124 may be, for example, nickel (Ni), copper (Cu), palladium (Pd), or alloys thereof, but the conductive metal is not limited thereto.

In this regard, a method of printing the conductive paste may include a screen printing method or a gravure printing method, etc., but the method of printing the conductive paste is not limited thereto.

The upper cover layer 112, the lower cover layer 113, and the connection region C may have the same materials and configurations as those of the dielectric layers 111 of the first capacitance forming region A except that the upper cover layer 112, the lower cover layer 113, and the connection region C do not include an internal electrode.

The upper cover layer 112 may be formed by stacking a single dielectric layer or two or more dielectric layers on an upper surface of the first capacitance forming region A, and may prevent the first and second internal electrodes 121 and 122 of the first capacitance forming region A from being damaged due to physical or chemical stress.

The lower cover layer 113 may be formed by stacking a single dielectric layer or two or more dielectric layers on a lower surface of the second capacitance forming region B, and may prevent the third and fourth internal electrodes 123 and 124 of the second capacitance forming region B from being damaged due to physical or chemical stress.

The connection region C may include the plurality of dielectric layers 111, and may form a predetermined gap between the first capacitance forming region A and the second capacitance forming region B. In this regard, at least one or more dummy electrodes 125 may be disposed with the dielectric layers 111 interposed therebetween at a location adjacent to the first capacitance forming region A in the connection region C.

As such, if the dummy electrodes 125 are disposed adjacently to the first capacitance forming region A, although the connection region C does not have a great thickness, ESL of the first capacitance forming region A may increase.

Figure 5:
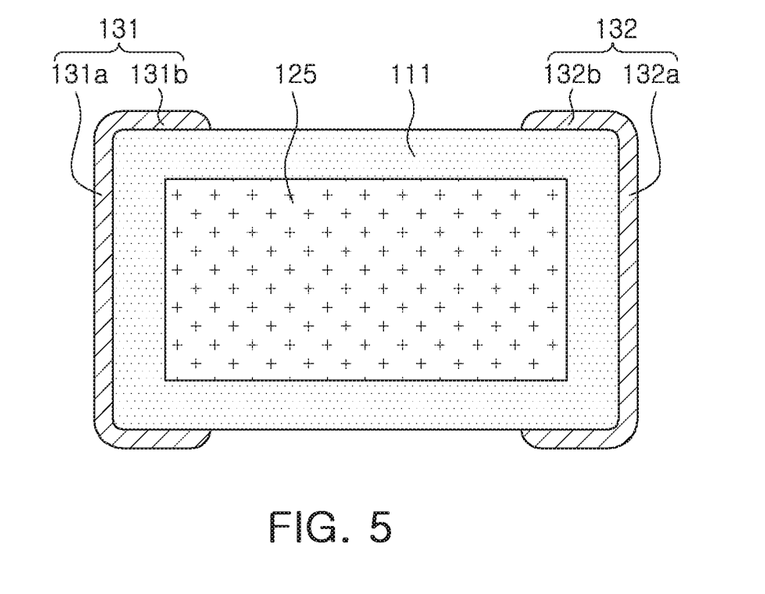
FIG. 5 is a plan view of a dummy electrode of FIG. 1 according to an exemplary embodiment in the present disclosure.

That is, a capacitance forming region generates a flux in its periphery when current flows. A greater flux may be generated through the dummy electrodes 125 disposed adjacently to the periphery of the first capacitance forming region A, and thus parasitic inductance (ESL) of the first capacitance forming region A may increase. Referring to FIG. 5, the dummy electrodes 125 of the present exemplary embodiment may be floating electrodes, as an example.

Figure 6:
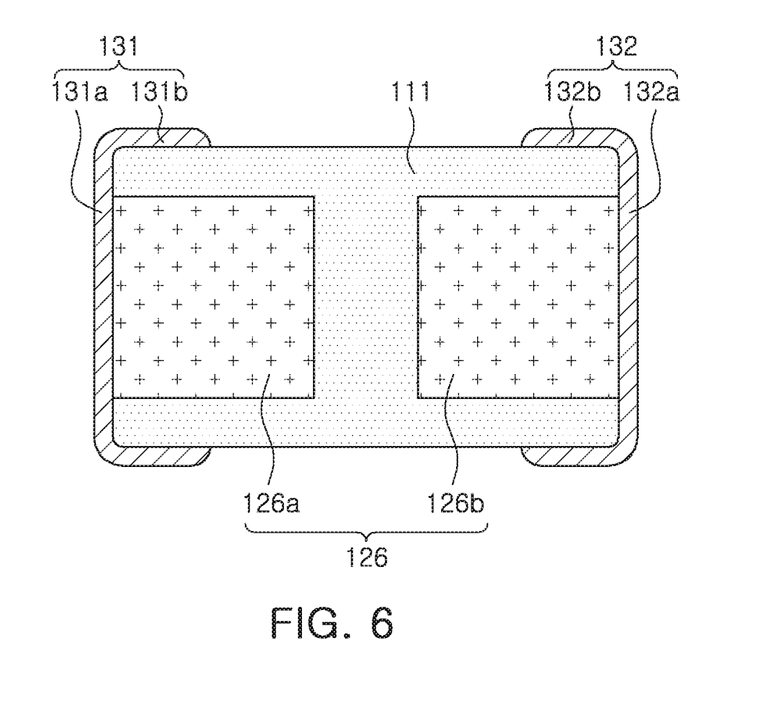
FIG. 6 is a plan view of a dummy electrode of FIG. 1 according to another exemplary embodiment in the present disclosure.

As another example, referring to FIG. 6, the dummy electrodes 126 of the exemplary embodiment may include first and second dummy electrodes 126a and 126b disposed on one of the dielectric layers 111 and spaced apart from each other by a predetermined gap. End portions of the first and second dummy electrodes 126a and 126b may be respectively exposed through the third and fourth surfaces 3 and 4 of the capacitor body 110 so that the first and second dummy electrodes 126a and 126b may be connected to the first and second external electrodes 131 and 132.

Figure 7:
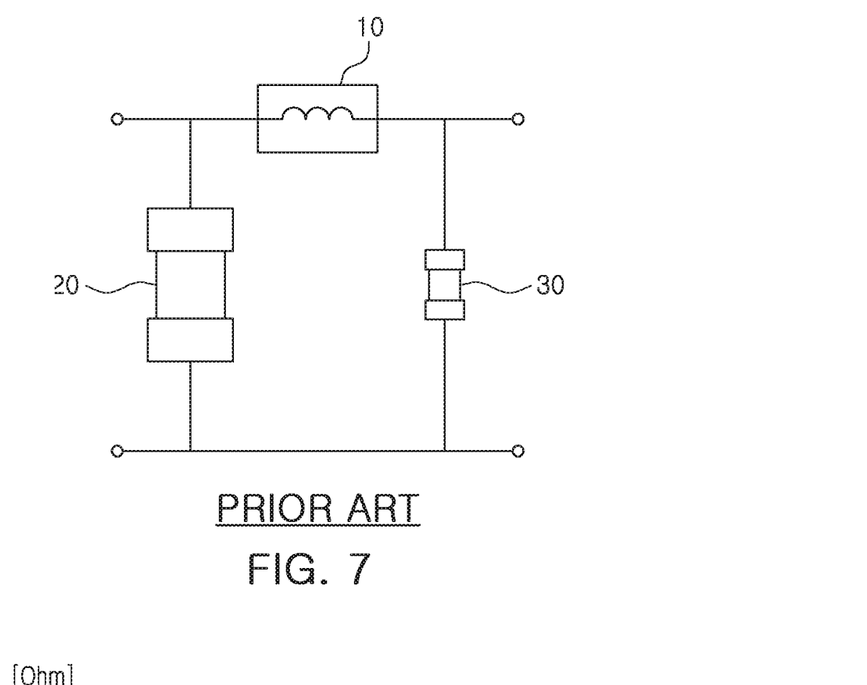
FIG. 7 is a circuit diagram schematically illustrating two general multilayer capacitors that are connected in parallel to each other.
Figure 8:
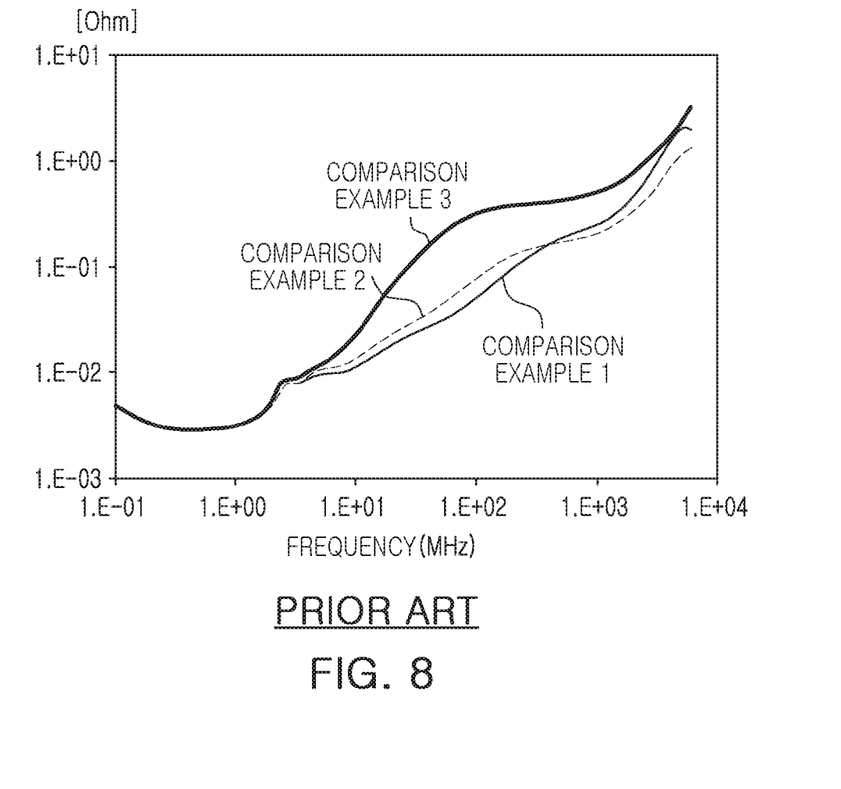
FIG. 8 is a graph of ESR with respect to FIG. 7.

FIG. 7 is a circuit diagram schematically illustrating two general multilayer capacitors that are connected in parallel with each other. FIG. 8 is a graph of ESR with respect to FIG. 7.

In this regard, Comparison Example 1 illustrates ESR of a first capacitor 20, Comparison Example 2 illustrates ESR when the first capacitor 20 and a second capacitor 30 are connected by 200 pH, and Comparison Example 3 illustrates ESR when the first capacitor 20 and the second capacitor 30 are connected by 1 nH.

Referring to FIGS. 7 and 8, it may be seen that when the first and second capacitors 20 and 30 having two different capacitances are connected in parallel with each other, whether to implement a high ESR characteristic of the second capacitor 30 is determined according to ESR connected between the first and second capacitors 20 and 30. That is, when impedance by a sum of the first capacitor 20 and a PCB trace 10 is higher than the ESR of the second capacitor 30, the high ESR characteristic at a high frequency may be implemented.

In the present exemplary embodiment, the first capacitance forming region A which is a high capacitance region and the second capacitance forming region B which is a low capacitance region may be configured to be connected in parallel with each other, the connection region C in which an internal electrode implementing capacitance is not formed may be disposed between the first capacitance forming region A and the second capacitance forming region B, and capacitance of the first capacitance forming region A may be configured to be greater than capacitance of the second capacitance forming region B.

That is, in the present exemplary embodiment, although the second capacitance forming region B is designed to have ESR of several hundreds of mohm at a frequency band from 100 MHz to 300 MHz, if a length of the connection region C is increased, and the connection region C is connected in parallel with the first capacitance forming region A, a total ESR of the multilayer capacitor 100 does not greatly increase due to the impedance of the first capacitance forming region A in spite of the high ESR of the second capacitance forming region B.

The dummy electrodes 125 disposed adjacently to the first capacitance forming region A in the connection region C may increase parasitic inductance of the first capacitance forming region A which is the high capacitance region, and thus the high ESR characteristic may be implemented while a thickness of the connection region C is reduced.

Figure 9:
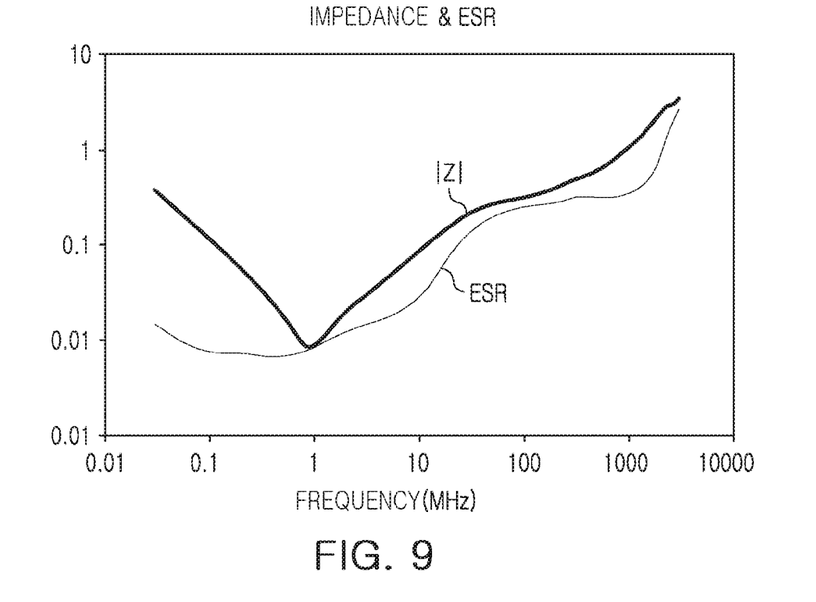
FIG. 9 is a graph illustrating variations of impedance and ESR with respect to a frequency of a multilayer capacitor according to an exemplary embodiment in the present disclosure.

FIG. 9 is a graph illustrating variations of impedance and ESR with respect to a frequency of a multilayer capacitor according to an exemplary embodiment in the present disclosure.

Referring to FIG. 9, a low ESL characteristic at high frequency may be implemented only when a center of a region of the dummy electrode 125 is located higher than a center location of the connection region C. That is, only when the dummy electrode 125 is disposed more adjacently to the first capacitance forming region A than the second capacitance forming region B, since ESL of the second capacitance forming region B is not influenced, the ESL of the second capacitance forming region B operating at high frequency may be reduced.

Board Having Multilayer Capacitor

Figure 10:
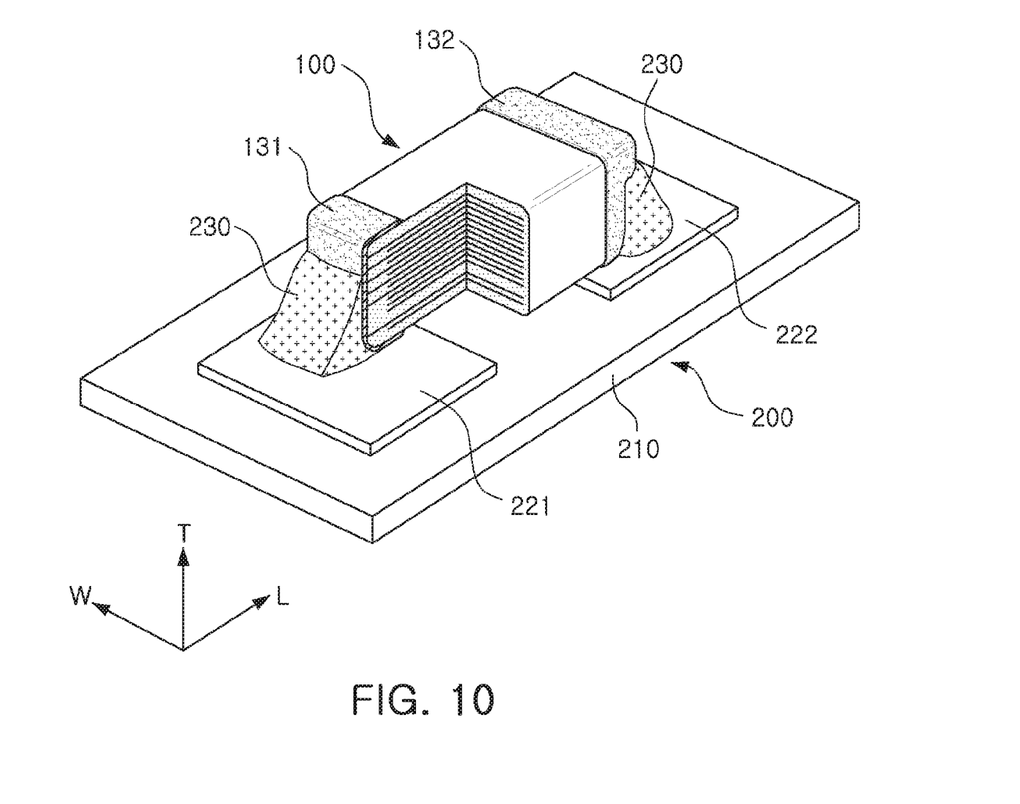
FIG. 10 is a perspective view illustrating the multiplayer capacitor of FIG. 1 mounted on a circuit board.
Figure 11:
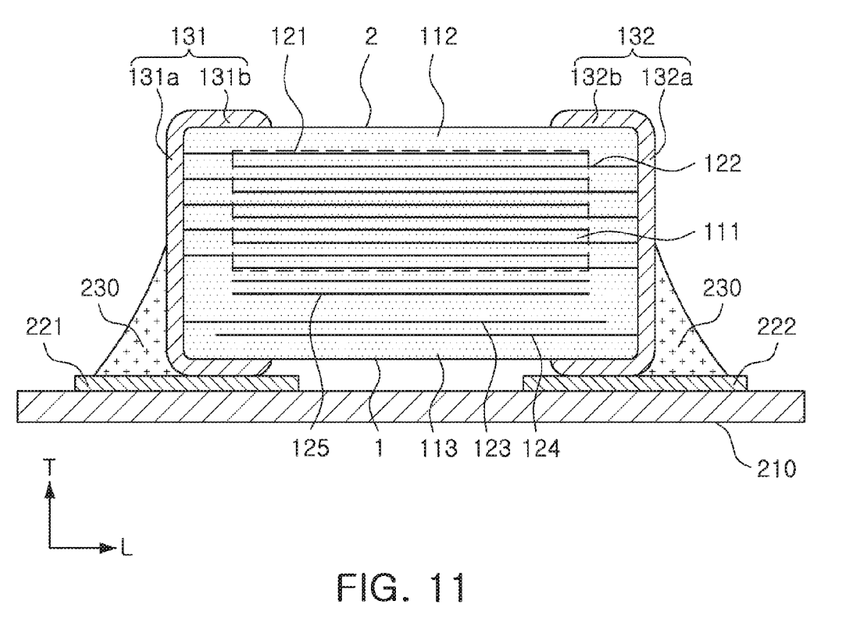
FIG. 11 is a cross-sectional view of FIG. 10 cut in a length direction.

Referring to FIGS. 10 and 11, a board 200 on which the multilayer capacitor 100 according to the present exemplary embodiment is mounted may include a circuit board 210 on which the multilayer capacitor 100 is mounted and first and second electrode pads 221 and 222 formed on an upper surface of the circuit board 210 and spaced apart from each other.

In this regard, the multilayer capacitor 100 may be electrically connected to the circuit board 210 by a solder 230 in a state where the second capacitance forming region B is disposed at a lower side and lower surfaces of the first and second band parts 131b and 132b of the first and second external electrodes 131 and 132 which are in contact with and located on the first and second electrode pads 221 and 222, respectively.

As set forth above, according to exemplary embodiments in the present disclosure, there is an effect that a ripple voltage generated at a high frequency is reduced by replacing a conventional DC-DC input capacitor, and thus high frequency noise and EMI are reduced, thereby preventing a communications obstacle and sound quality deterioration of a small portable terminal.

While exemplary embodiments have been shown and described above, it will be apparent to those skilled in the art that modifications and variations could be made without departing from the scope of the present invention as defined by the appended claims.

What is claimed is:

1. A multilayer capacitor comprising:
a capacitor body including a first capacitance forming region and a second capacitance forming region disposed to face each other with a connection region of a predetermined thickness in which an internal electrode is not formed disposed therebetween, a thickness of the first capacitance forming region being greater than a thickness of the second capacitance forming region; and
first and second external electrodes disposed on first and second ends of the capacitor body in a length direction,
wherein the first capacitance forming region includes a plurality of dielectric layers and first and second internal electrodes with at least one among the plurality of dielectric layers disposed therebetween, the first and second internal electrodes being alternately exposed to first and second surfaces of the first capacitance forming region in the length direction, respectively,
wherein the second capacitance forming region includes a plurality of dielectric layers and third and fourth internal electrodes with at least one among the plurality of dielectric layers disposed therebetween, the third and fourth internal electrodes being alternately exposed to first and second surfaces of the second capacitance forming region in the length direction, respectively, and
wherein the connection region includes a plurality of dielectric layers and at least one dummy electrode disposed to have a shorter average distance to the first capacitance forming region than to the second capacitance forming region,
the predetermined thickness is greater than an average thickness of the plurality of dielectric layers of the first and second capacitance forming regions,
the first and second internal electrodes are formed to have a uniform width,
the third and fourth internal electrodes respectively include first and second body parts configured to overlap each other and first and second lead parts extending from the first and second body parts to be respectively connected to the first and second external electrodes, and
widths of the first and second lead parts are smaller than widths of the first and second body parts, respectively.

2. The multilayer capacitor of claim 1, wherein a surface of the capacitor body adjacent to the second capacitance forming region is a mounting surface.

3. The multilayer capacitor of claim 1, wherein the at least one or more dummy electrodes are floating electrodes.

4. The multilayer capacitor of claim 1, wherein the at least one or more dummy electrodes are configured as first and second dummy electrodes disposed on one of the plurality of dielectric layers by a predetermined gap and formed to have ends respectively connected to the first and second external electrodes.

5. A board having a multilayer capacitor, the board comprising:
a circuit board including first and second electrode pads on an upper portion; and
the multilayer capacitor mounted on the circuit board, wherein the multilayer capacitor includes:

a capacitor body including a first capacitance forming region and a second capacitance forming region disposed to face each other with a connection region in which an internal electrode is not formed disposed therebetween, a thickness of the first capacitance forming region being greater than a thickness of the second capacitance forming region and the second capacitance forming region disposed to be adjacent to the circuit board; and first and second external electrodes disposed on first and second ends of the capacitor body in the length direction and respectively connected onto the first and second electrode pads, wherein the first capacitance forming region includes a plurality of dielectric layers and first and second internal electrodes with at least one among the plurality of dielectric layers disposed therebetween, the first and second internal electrodes being alternately exposed to first and second surfaces of the first capacitance forming region in the length direction, respectively, wherein the second capacitance forming region includes a plurality of dielectric layers and third and fourth internal electrodes with at least one among the plurality of dielectric layers disposed therebetween, the third and fourth internal electrodes being alternately exposed to first and second surfaces of the second capacitance forming region in the length direction, respectively, and wherein the connection region includes a plurality of dielectric layers and at least one dummy electrode disposed to have a shorter average distance to the first capacitance forming region than to the second capacitance forming region, the predetermined thickness is greater than an average thickness of the plurality of dielectric layers of the first and second capacitance forming regions, the first and second internal electrodes are formed to have a uniform width, the third and fourth internal electrodes respectively include first and second body parts configured to overlap each other and first and second lead parts extending from the first and second body parts to be respectively connected to the first and second external electrodes, and widths of the first and second lead parts are smaller than widths of the first and second body parts, respectively.

6. The board of claim 5, wherein the at least one or more dummy electrodes are floating electrodes.

7. The board of claim 5, wherein the at least one or more dummy electrodes are configured as first and second dummy electrodes disposed on one of the plurality of dielectric layers by a predetermined gap and formed to have ends respectively connected to the first and second external electrodes.

* * * * *